(12) United States Patent
Satoh et al.

(10) Patent No.: US 7,777,202 B2
(45) Date of Patent: Aug. 17, 2010

(54) ELECTRON BEAM EXPOSURE APPARATUS INVOLVING THE POSITION AND VELOCITY CALCULATION

(75) Inventors: Takamasa Satoh, Tokyo (JP); Yoshihisa Ooae, Tokyo (JP)

(73) Assignee: Advantest Corp., Tokyo (JP)

( * ) Notice: Subject to any disclaimer, the term of this patent is extended or adjusted under 35 U.S.C. 154(b) by 692 days.

(21) Appl. No.: 11/729,673

(22) Filed: Mar. 28, 2007

(65) Prior Publication Data
US 2008/0277598 A1 Nov. 13, 2008

(30) Foreign Application Priority Data
Apr. 28, 2006 (JP) ............................. 2006-125312

(51) Int. Cl.
*G21K 5/10* (2006.01)
(52) U.S. Cl. ................ 250/492.2; 250/396 R; 250/397; 250/492.1
(58) Field of Classification Search ............. 250/492.1, 250/491.1, 492.2, 492.22, 492.21, 492.3, 250/306, 307, 309, 310, 311, 396 R, 398, 250/400; 430/296, 297, 298; 318/560, 567, 318/568.1, 568.15
See application file for complete search history.

(56) References Cited

U.S. PATENT DOCUMENTS

| | | | | | |
|---|---|---|---|---|---|
| 4,698,509 | A | * | 10/1987 | Wells et al. | 250/492.2 |
| 5,124,560 | A | * | 6/1992 | Fueki | 250/492.2 |
| 7,542,141 | B2 | * | 6/2009 | Kurosawa | 356/399 |
| 2003/0094584 | A1 | * | 5/2003 | Yui et al. | 250/492.22 |
| 2004/0232867 | A1 | * | 11/2004 | Fasen | 318/568.18 |

FOREIGN PATENT DOCUMENTS
JP 10-177941 6/1998

* cited by examiner

*Primary Examiner*—Jack I Berman
*Assistant Examiner*—Nicole Ippolito Rausch
(74) *Attorney, Agent, or Firm*—Muramatsu & Associates

(57) ABSTRACT

An electron beam exposure apparatus includes: an electron gun for generating an electron beam; a deflector for deflecting the electron beam; a wafer stage; a stage position detector for detecting a position of the wafer stage; and a stage position computing unit for calculating a movement velocity of the wafer stage. On a basis of the movement velocity, the stage position computing unit calculates an amount of positional change of the wafer stage with respect to an interpolation time, and subsequently calculates an amount of positional movement of the wafer stage by sequentially adding the amount of positional change to the position of the wafer stage in synchronism with the interpolation time. Thus, the stage position computing unit calculates an amount of deflection of the electron beam corresponding to the amount of the positional movement of the wafer stage.

5 Claims, 8 Drawing Sheets

ELECTRON BEAM EXPOSURE APPARATUS INVOLVING THE POSITION AND VELOCITY CALCULATION

CROSS-REFERENCE TO RELATED APPLICATIONS

This application is based on and claims priority of Japanese Patent Application No. 2006-125312 filed on Apr. 28, 2006, the entire contents of which are incorporated herein by reference.

BACKGROUND OF THE INVENTION

1. Field of the Invention

The present invention relates to an electron beam exposure apparatus, and particularly to an electron beam exposure apparatus using a continuous stage moving method.

2. Description of the Prior Art

For the purpose of increasing the throughput of an electron beam exposure apparatus, a continuous stage moving method has been proposed.

The continuous stage moving method refers to a method of carrying out writing while moving a stage on which a wafer is held at a predetermined velocity. This method feeds back positional change of the stage to a deflector of an electron beam, and thus carries out an exposure as if a point of irradiation of the electron beam on the wafer did not move when viewed from an electron gun as a reference point.

Japanese Patent Application Laid-open Publication No. Hei 10-177941 has disclosed an electron beam exposure apparatus using a continuous stage moving method of this kind.

FIG. 1 is a diagram showing a schematic configuration of an electron beam exposure apparatus using a continuous stage moving method of a conventional type. The electron beam exposure apparatus includes an electron gun 13, a deflector 14, a wafer stage 15, a stage driving unit 16 and a feedback circuit 17. The electron gun 13 is to emit an electron beam 12. The deflector 14 is to deflect the electron beam 12. The wafer stage 15 is to fix a wafer 11 thereon. The stage driving unit 16 moves the wafer stage 15. The feedback circuit 17 feeds back positional changes of the wafer stage 15 to the deflector 14.

The feedback circuit 17 is configured of a laser interferometer 20, a controller 21, a corrector 22, a D/A converter 23 and an operational amplifier 24. The laser interferometer 20 reads the position of the wafer stage 15. The operational amplifier 24 is connected to the deflector 14. The controller 21 outputs a deflection signal for deflecting the electron beam 12 in response to the positional change of the wafer stage 15 which has been measured by the laser interferometer 20, and on a signal from the corrector 22. The D/A converter 23 converts this deflection signal from a digital signal to an analog signal, and the operational amplifier 24 amplifies the analog signal. Thus, the amplified analog signal is applied to the deflector 14. The feedback of the positional change of the wafer stage in this manner makes it possible to carry out the writing by causing the electron beam to follow a movement of the wafer stage no matter how the wafer stage moves.

As described above, the electron beam exposure apparatus using the continuous stage moving method of the conventional type carries out writing by causing the electron beam to follow the movement of the wafer stage no matter how the wafer stage moves.

A laser interferometer using a measurement frequency of approximately 10 MHz has been heretofore used for measuring a position of the wafer stage. For this reason, when the wafer stage moves at a velocity of 10 mm/s, a distance over which the wafer stage moves in a measurement cycle of 100 nanoseconds is 1 nm. As a result, an error in the stage feedback is as small as 1 nm. This does not cause a specific practical problem.

Recently, however, there has been an increasingly strong demand for carrying out the writing at a higher speed. It has become essential that the wafer stage be moved at a higher velocity. This has made it increasingly difficult to deflect the electron beam in order to follow the movement of the wafer stage.

FIG. 2A is a diagram showing how the position of a wafer stage changes when a frequency with which the position of the wafer stage is measured is 10 MHz and a velocity at which the wafer stage moves is 100 mm/s. FIG. 2B is a diagram showing how large a deflection voltage corresponding to the positional change of the wafer stage is, when a frequency with which the position of the wafer stage is measured is 10 MHz, and a velocity at which the wafer stage moves is 100 mm/s. When the velocity at which the wafer stage moves is 100 mm/s, the wafer stage moves over a distance of 10 nm in the measurement cycle of 100 nanoseconds. For this reason, even in a case where the wafer stage continuously moves, the electron beam is not deflected in the measurement cycle of 100 nanoseconds. This causes a 10-nm error in the stage feedback.

By contrast, if a high-precision measuring machine using a measurement frequency of not less than 10 MHz is employed, this employment makes it possible to hold the error in the stage feedback at less than 1 nm. In reality, however, it is extremely difficult to procure high-speed and high-precision machines of this kind.

SUMMARY OF THE INVENTION

The present invention has been made in consideration of the foregoing problems involved in the conventional technologies. Thus, it is an object of the present invention to provide an electron beam exposure apparatus which is capable of deflecting an electron beam in response to the movement of a wafer stage.

The foregoing problems are solved by an electron beam exposure apparatus characterized by including an electron gun, a deflector, a wafer stage, a stage position detector, a stage position computing unit and a deflection controller. The electron gun generates an electron beam. The deflector deflects the electron beam. The wafer stage is is to place a wafer thereon. The stage position detector detects the position of the wafer stage. The stage position computing unit calculates an amount of deflection of the electron beam based on the following scheme. First, the stage position computing unit calculates the velocity at which the wafer stage has moved (hereinafter referred to as a "movement velocity of the wafer stage") on the basis of a distance over which the wafer stage has moved (hereinafter referred to as a "movement distance of the wafer stage"), and on the basis of the time which it has taken for the wafer stage to move over the distance, the position of the wafer stage having been detected by the stage position detector. On the basis of the movement velocity thus calculated, the stage position computing unit subsequently calculates an amount of the positional change of the wafer stage with respect to an interpolation time which is shorter than the measurement cycle of the stage position detector. Thereafter, the stage position computing unit calculates an amount of movement of the wafer stage from one position to another by sequentially adding the amount of the positional change to the position of the stage which is measured by the stage position detector in synchronism with the interpolation time. Thereby, the stage position computing unit calculates an amount of deflection of the electron beam which corresponds to the amount of the positional movement of the wafer stage. The deflection controller controls the deflector to deflect the electron beam on the basis of the amount of the deflection of the electron beam.

In the case of the electron beam exposure apparatus according to this embodiment, the stage position computing unit may calculate the amount of the positional change by multiplying the movement velocity of the wafer stage by the interpolation time. In addition, the stage position computing unit may include a memory in which the amount of the positional change corresponding to the movement velocity of the wafer stage is stored. The stage position computing unit may access the memory by using a value corresponding to the movement velocity of the wafer stage as an address, and may thus extract from the memory the amount of the positional change in response to the movement velocity of the wafer stage.

Moreover, in the case of the electron beam exposure apparatus according to this embodiment, the stage position computing unit may be designed to determine the interpolation time in order that the amount of the positional change is less than a predetermined value, and the predetermined value may be 1 nm.

In the case of the present invention, the movement velocity of the wafer stage is calculated on the basis of a value obtained by measuring the position of the wafer stage, and thus the amount of the positional change of the wafer stage is calculated with respect to a time (an interpolation time) shorter than the measurement cycle in which the position of the wafer stage is detected. This amount of the positional change is sequentially added to the detected position of the wafer stage for each interpolation time. Thus, the amount of the positional movement of the wafer stage is estimated. Hence, the amount of the deflection of the electron beam is adjusted in order to correspond to this amount of the positional movement of the wafer stage. Thereby, the electron beam is irradiated on the wafer in response to the movement of the wafer stage. This makes it possible to deflect the electron beam in response to the movement of the wafer stage, to thus decrease the error in the stage feedback, and to accordingly increase the throughput of writing, even in a case where the wafer stage moves at a high velocity.

DESCRIPTION OF THE PREFERRED EMBODIMENT

Figure 1:
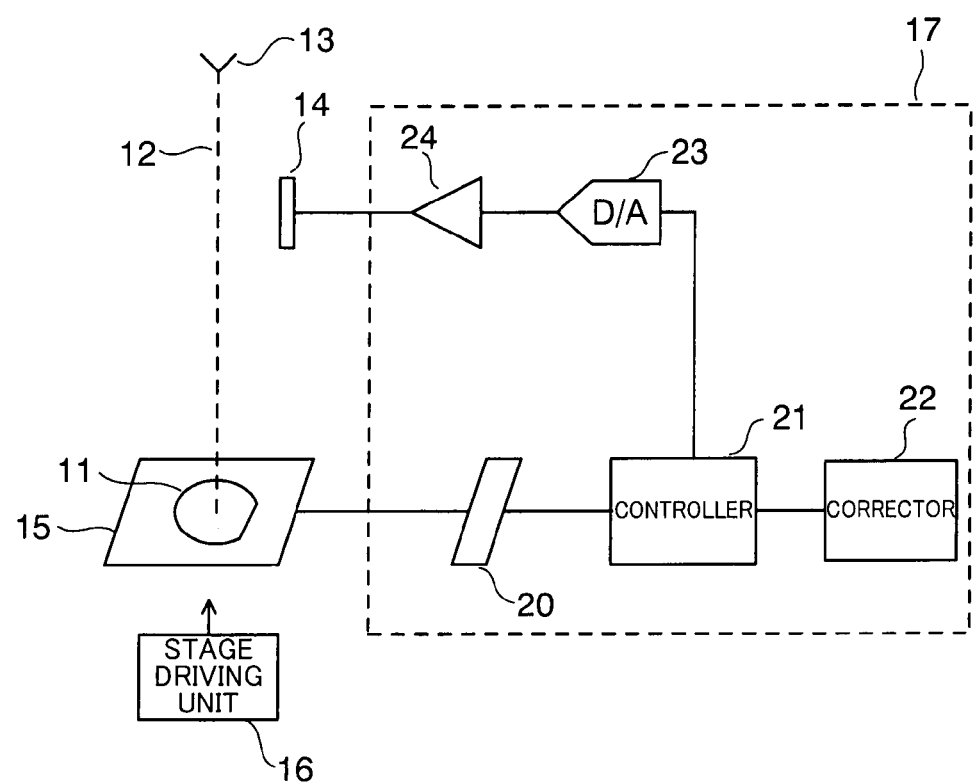
FIG. 1 is a diagram showing a schematic configuration of an electron beam exposure using a continuous stage moving method of a conventional type.
Figure 2A:
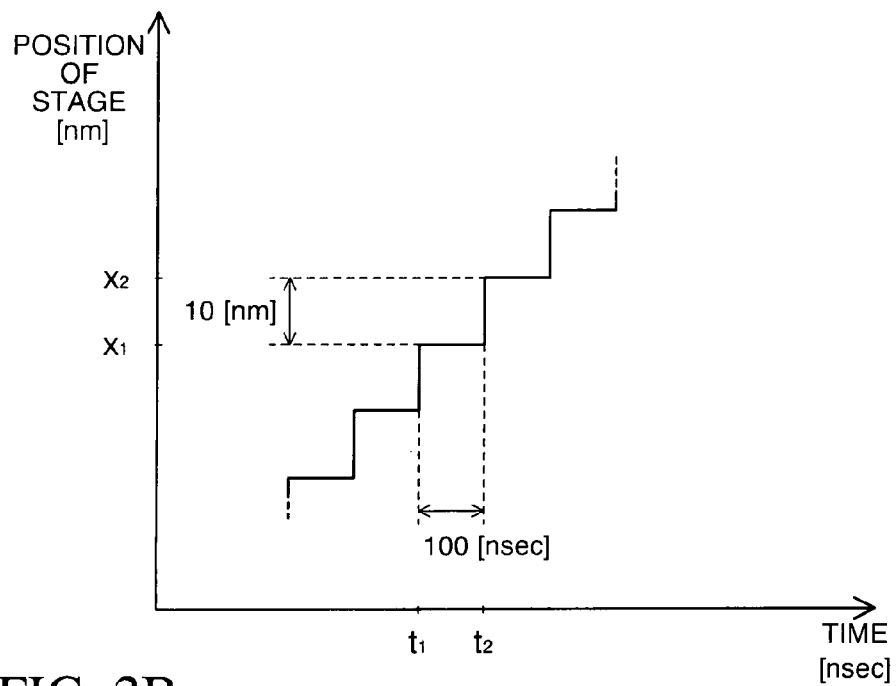
FIGS. 2A and 2B are diagrams showing problems which occur when a wafer stage is moved at a high velocity.
Figure 2B:
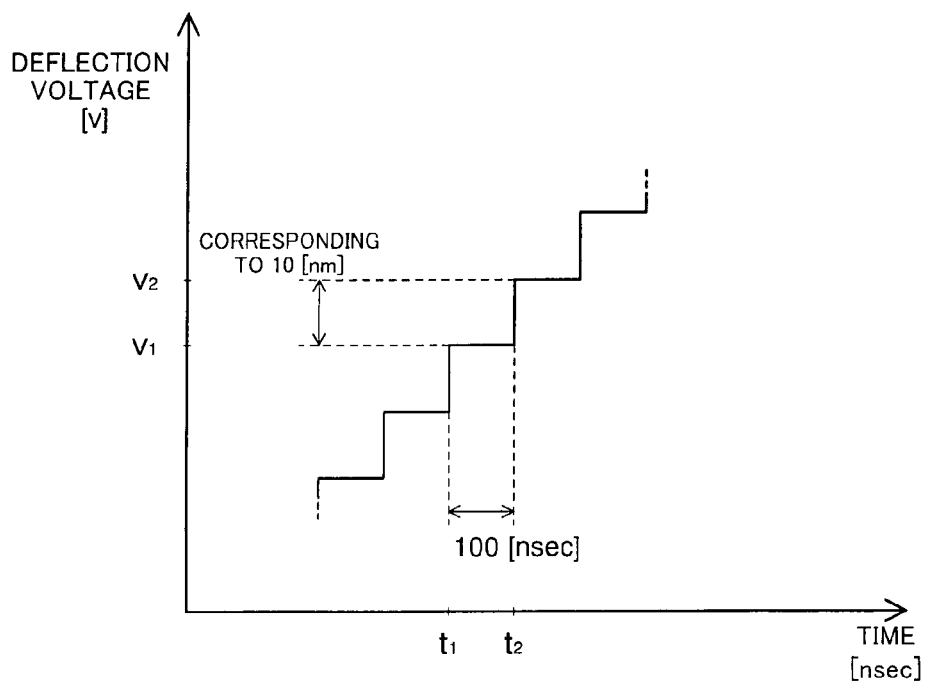

Descriptions will be provided below for an embodiment of the present invention by referring to the drawings.

First, descriptions will be provided for a configuration of an electron beam exposure apparatus. Subsequently, descriptions will be provided for a stage feedback unit. Thereafter, descriptions will be provided for an estimated interpolation computation for calculating an amount of positional change of a wafer stage. Then, descriptions will be provided for an electron beam exposure method using the estimated interpolation computation. Finally, descriptions will be provided for an estimated interpolation computation using information stored in a memory.

Configuration of Electron Beam Exposure Apparatus

Figure 3:
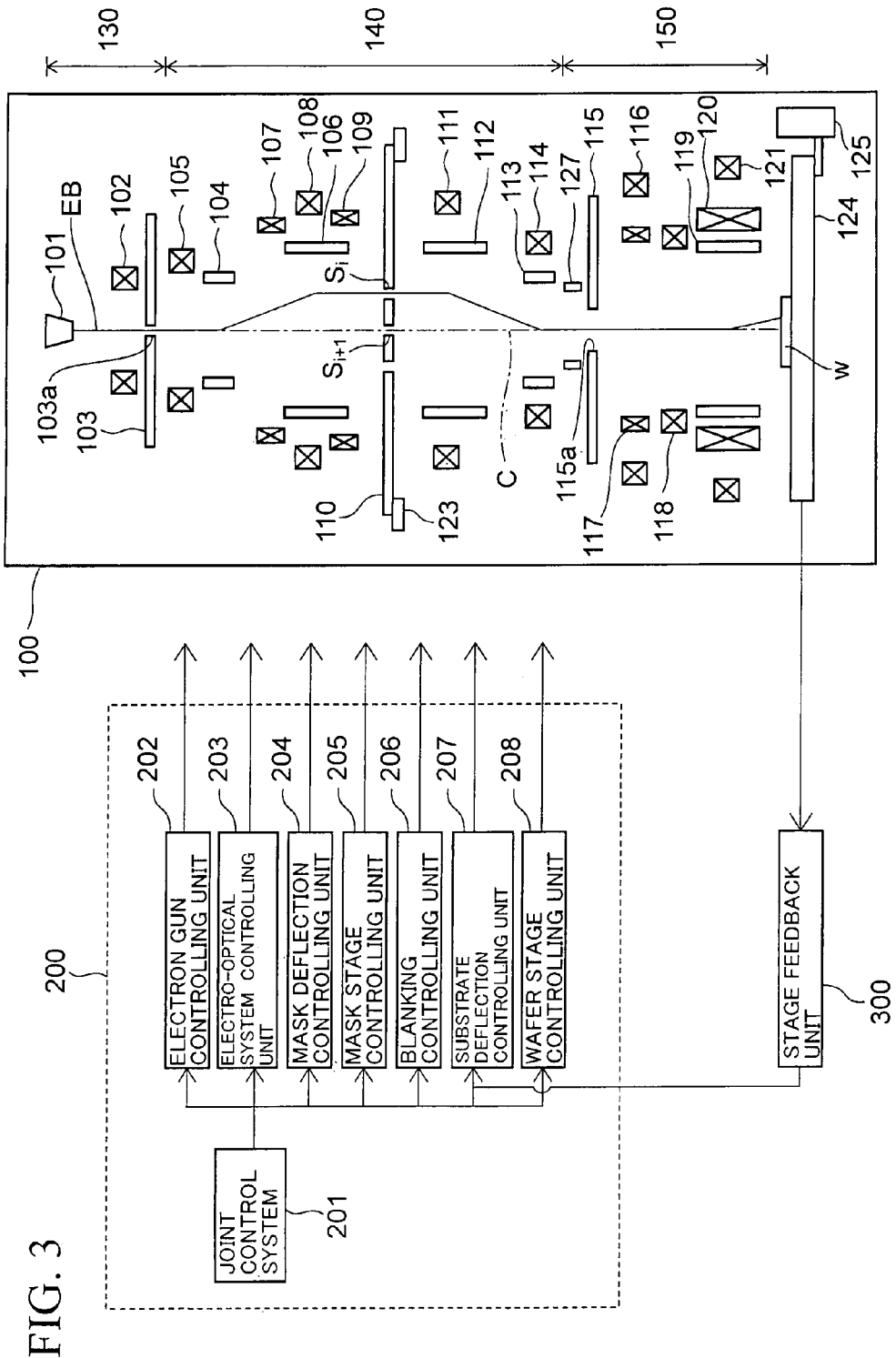
FIG. 3 is a diagram of a configuration of an electron beam exposure apparatus according to the present invention.

FIG. 3 is a diagram showing a configuration of the electron beam exposure apparatus according to the present embodiment.

The electron beam exposure apparatus can be roughly broken down into an electro-optical system column 100, a control module 200 and a stage feedback unit 300. The control module 200 controls the components of the electro-optical system column 100. The electro-optical system column 100 is configured of an electron beam generator 130, a mask deflector 140 and a substrate deflector 150. The pressure of the interior of the electro-optical system column 100 is reduced.

In the electron beam generator 130, an electron beam EB is generated by an electron gun 101. A first electromagnetic lens 102 causes the electron beam EB to undergo a convergent effect. Thereafter, the resultant electron beam EB passes through a rectangular aperture 103a of a beam shaping mask 103. Thereby, the cross-section of the resultant electron beam EB is shaped into a rectangle.

Subsequently, a second electromagnetic lens 105 of the mask deflection unit 140 causes the electron beam EB to form an image on an exposure mask 110. A first electrostatic deflector 104 and a second electrostatic deflector 106 deflect the electron beam EB to a specific pattern Si formed in the exposure mask 110. Thus, the cross-section of the electron beam EB is shaped into the pattern Si.

It should be noted that, although the exposure mask 110 is fixed to a mask stage 123, the mask stage 123 is capable of moving in the horizontal plane. In a case where a pattern S existing in a part beyond a deflection range (beam deflection area) of the first electrostatic defector 104 and the second electrostatic deflector 106 is intended to be used, the pattern S is moved into the beam deflection area by moving the mask stage 123.

A third electromagnetic lens 108 arranged above the exposure mask 110 and a fourth electromagnetic lens 111 below the exposure mask 110 play a role of causing the electron beam EB to form an image on a substrate W by adjusting an amount of electric current flowing to each of the third electromagnetic lens 108 and the fourth electromagnetic lens 111.

The electron beam EB which has passed through, and come out of, the exposure mask 110 is swung back to the optical axis C by deflection effects respectively of, a third electrostatic deflector 112 and a fourth electrostatic deflector 113. Thereafter, the size of the electron beam EB is reduced by a fifth electromagnetic lens 114.

The mask deflection unit 140 is provided with a first correction coil 107 and a second correction coil 109. A beam deflection aberration which has been generated by the first to fourth electrostatic deflectors 104, 106, 112 and 113 is corrected by the first correction coil 107 and the second correction coil 109.

Afterward, the electron beam EB passes through, and comes out of, an aperture 115a of a shielding plate 115 constituting the substrate deflection unit 150. Subsequently, a first projection electromagnetic lens 116 and a second projection electromagnetic lens 121 project the resultant electron beam on the substrate W. Thereby, an image of a pattern of the exposure mask 110 is transferred to the substrate W with a predetermined reduction ratio, for example, with a reduction ratio of 1/10.

The substrate deflection unit 150 is provided with a fifth electrostatic deflector 119 and an electromagnetic deflector 120. These deflectors 119 and 120 deflect the electron beam EB, and thus the image of the pattern of the exposure mask is projected to the substrate W at a predetermined position.

In addition, the substrate deflection unit 150 is provided with a third correction coil 117 and a fourth correction coil 118 each for correcting a deflection aberration of the electron beam EB on the substrate W.

The substrate W is fixed to a wafer stage 124 which is capable of moving in the horizontal direction by a driving unit 125 such as a motor. The moving of the wafer stage 124 makes it possible to expose the entire surface of the substrate W.

The control module 200 includes an electron gun controlling unit 202, an electro-optical system controlling unit 203, a mask deflection control unit 204, a mask stage controlling unit 205, a blanking controlling unit 206, a substrate deflection controlling unit 207 and a wafer stage controlling unit 208. The electron gun controlling unit 202 controls the electron gun 101, and thus controls an acceleration voltage of the electron beam EB, conditions for beam irradiation, and the like. In addition, the electro-optical system controlling unit 203 controls an amount of electric current which flows to each of the electromagnetic lenses 102, 105, 108, 111, 114, 116 and 121, and thus adjusts the magnification, the focal position and the like of the electro-optical system in which these electromagnetic lenses are configured. The blanking controlling unit 206 controls a voltage which is applied to a blanking electrode 127. Thereby, the electron beam EB which has been generated before the exposure is deflected to the shielding plate 115 so that the electron beam EB is prevented from being irradiated on the substrate before the exposure.

The substrate deflection controlling unit 207 controls a voltage which is applied to the fifth electrostatic deflector 119 and an amount of electric current which flows to the electromagnetic deflector 120. Thereby, the electron beam EB is designed to be deflected to the substrate W at a predetermined position.

The wafer stage controlling unit 208 adjusts an amount of drive of the driving unit 125. Thus, the substrate W is moved in a horizontal direction. Thereby, the electron beam is irradiated on the substrate W at a desired position. The foregoing units 202 to 208 are jointly controlled by a joint control system 201 such as a workstation.

The stage feedback unit 300 detects a positional change of the wafer stage 124 in the electron beam exposure apparatus using the continuous stage moving method. Depending on the change, the stage feedback unit 300 generates a deflection voltage for deflecting the electron beam, and transmits the deflection voltage to the substrate deflection controlling unit 207.

Configuration of Stage Feedback Unit

Figure 4A:
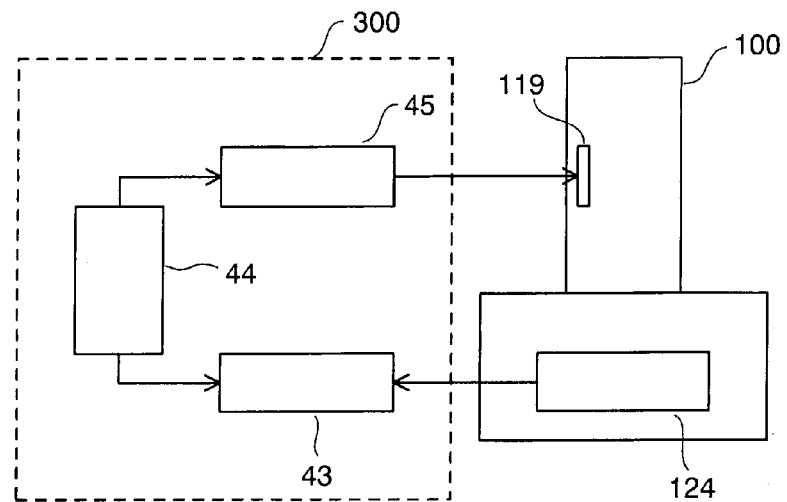
FIGS. 4A and 4B are block diagrams of a configuration of a stage feedback circuit according to the present invention.

FIG. 4A is a diagram showing a configuration of the stage feedback unit 300.

The stage feedback unit 300 is configured of a laser interferometer (stage position detector) 43, a computing unit (stage position computing unit) 44 and a DAC-AMP unit (stage position computing unit) 45.

The laser interferometer 43 emits a laser beam to the wafer stage 124, and thus detects the position of the wafer stage 124.

The computing unit 44 is configured, for example, of a microcomputer. The computing unit 44 calculates a movement velocity of the wafer stage 124 which is moving. In addition, on the basis of the movement velocity of the wafer stage 124, the computing unit 44 calculates an estimated amount of the positional change of the wafer stage 124 which occurs in a cycle shorter than a measurement cycle in which the position of the wafer stage 124 is measured. Thus, the computing unit 44 calculates an amount of stage feedback (amount of positional movement of the wafer stage).

The DAC-AMP unit 45 converts the amount of stage feedback which has been calculated by the computing unit 44 from a digital amount to an analog amount, amplifies the resultant analog signal, and thus transmits the analog signal to the substrate deflection controlling unit 207. The substrate deflection controlling unit 207 supplies a deflection voltage to a deflector 119 in the column 100. Thereby, the electron beam is deflected.

Figure 4B:
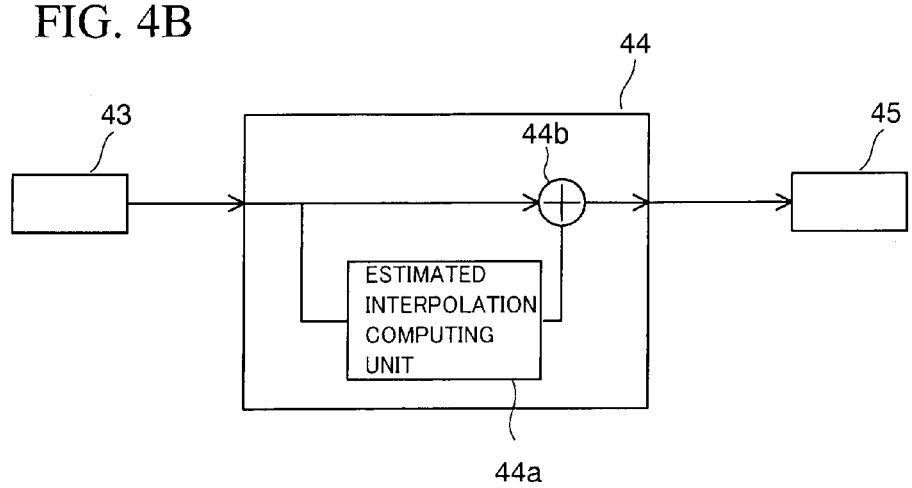

FIG. 4B is a block diagram showing an example of a configuration of the computing unit 44. The computing unit 44 is configured of an estimated interpolation computing unit 44a and an adding unit 44b.

The estimated interpolation computing unit 44a estimates an amount of positional change of the wafer stage 124 with respect to a time (an interpolation time) shorter than the measurement cycle, on the basis of which position and what time the wafer stage 124 has been detected, where the position and the time having been received from the laser interferometer 43.

The adding unit 44b adds the amount of positional change of the wafer stage 124 which has been estimated by the estimated interpolation computing unit 44a to the position of the wafer stage 124 which has been detected by the laser interferometer 43. Thereafter, the adding unit 44b transmits the result of the addition to the DAC-AMP unit 45.

In the stage feedback unit 300 configured in this manner, the laser interferometer 43 reads the position of the moving wafer stage 124 at predetermined intervals, for example, in every 100 nanoseconds. Thus, the laser interferometer 43 outputs the position to the computing unit 44. The computing unit 44 calculates a movement velocity of the wafer stage 124 on the basis of the positions and the respective times when the wafer stage has been detected, where the positions and the times have been received from the laser interferometer 43. Based on the movement velocity thus calculated, the computing unit 44 estimates an amount of positional change (also referred to as an "estimated amount of interpolation") of the wafer stage 124 with respect to the interpolation time which is shorter than the measurement cycle used by the laser interferometer 43. Subsequently, the computing unit 44 sequentially adds the estimated amount of interpolation to the position of the wafer stage 124, which is detected at each of desired times, in synchronism with the interpolation time.

Thus, the computing unit 44 generates an amount of stage feedback, for example, in every 10 nanoseconds, and transmits the amount of stage feedback to the DAC-AMP unit 45.

Computation of Estimated Interpolation

Description will be provided below for how the estimated interpolation is computed in the case of the present embodiment, by referring to FIGS. 5A to 5D. In the case of the present embodiment, it is assumed that the position of the wafer stage is measured by the laser interferometer at a frequency of 10-MHz. As a result, it is assumed that the position of the wafer stage is measured at every 100 nanoseconds. In addition, it is assumed that the wafer stage moves at a velocity of 100 mm/s. Furthermore, it is assumed that an allowable error in the stage feedback is 1 nm.

With the foregoing conditions taken into consideration, the wafer stage moves over a distance of 10 nm (=100×10$^{-3}$× 100×10$^{-9}$) in the measurement cycle of 100 nanoseconds. As a result, a possible error in the stage feedback is 10 nm in the conventional technology. In other words, despite of the movement of the wafer stage 124, the computing unit 44 determines that the position of the wafer stage 124 at a measurement time $t_n$ (nanoseconds) is the same as the position of the wafer stage 124 at a measurement time $t_{n+1}$ (nanoseconds). For this reason, although the wafer stage 124 moves, the electron beam is not capable of being deflected in response to the movement.

To solve this background problem, the present inventors have conceived a method which makes it possible to deflect the electron beam in response to the movement of the wafer stage 124 by calculating an amount of positional change (estimated amount of interpolation) of the wafer stage 124 in a cycle shorter than the measurement cycle used by the laser interferometer 43.

The estimated amount of interpolation is calculated as follows.

The movement velocity of the wafer stage is calculated on the basis of values obtained by measuring the positions of the wafer stage respectively from two different positions, which are received every 100 nanoseconds.

Figure 5B:
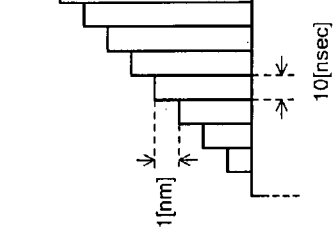
FIGS. 5A to 5D are diagrams each illustrating a process performed by the stage feedback circuit as shown in FIGS. 4A and 4B.
Figure 5D:
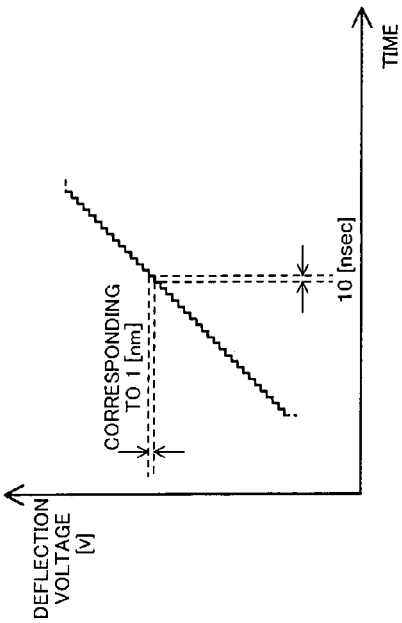
Figure 5A:
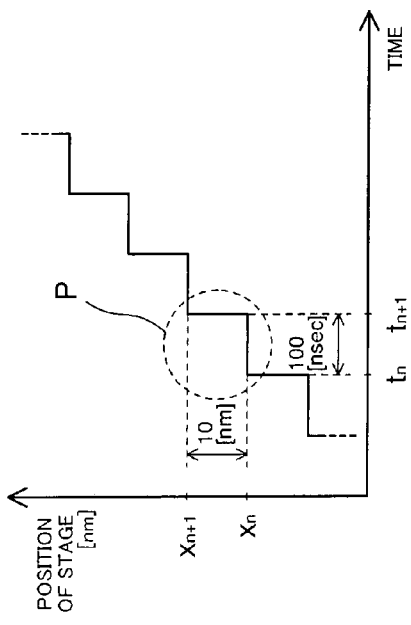

FIG. 5A is a diagram showing a relationship between times when the laser interferometer 43 detects the wafer stage and positions where the laser interferometer 43 detects the wafer stage. In the case of the present embodiment, the frequency with which the laser interferometer 43 measures the position of the wafer stage is 10 MHz, and the position of the wafer stage is updated every 100 nanoseconds. In other words, $x_n$ denotes the position of the wafer stage at a detection time $t_n$, and $x_{n+1}$ denotes the position of the wafer stage at a detection time $t_{n+1}$ which is 100 nanoseconds past the detection time $t_n$. During the 100 nanoseconds, the detected position of the wafer stage continues to be denoted by $x_n$.

The movement velocity of the wafer stage 124 is calculated on the basis of the distance over which the wafer stage 124 has moved for the 100 nanoseconds.

When the movement velocity of the wafer stage 124 is calculated on the basis of a part denoted by P in FIG. 5A, the calculation result is 10 mm/s.

Subsequently, an estimated amount interpolation of the wafer stage 124 with respect to a time shorter than the cycle in which the laser interferometer 43 measures the position of the wafer stage 124 is calculated on the basis of the velocity at which the stage wafer 124 has moved. In the case of the present embodiment, the estimated amount interpolation corresponding to 10 nanoseconds is calculated. The reason why the estimated amount of interpolation is obtained at intervals of 10 nanoseconds is as follows. When the cycle in which the laser interferometer 43 measures the position of the wafer stage is 100 nanoseconds, an amount of the positional change of the wafer stage is 10 nm. As a result, the amount of the positional change of the wafer stage has to be divided by 10 for the purpose of holding an error in the stage feedback at a degree of 1 nm allowable error. Under this concept, intervals at which the estimated amount of interpolation is obtained may be further shortened for the purpose of making the error smaller than 1 nm.

FIG. 5B shows the result of computing an estimated amount of interpolation when dividing the estimated amount of interpolation by 10 every 10 nanoseconds. The estimated amount of interpolation is found by the estimated interpolation computing unit as shown in FIG. 4B through multiplying the movement velocity of the wafer stage by the interpolation time (=10 nanoseconds).

When, for example, the movement velocity of the wafer stage is 100 mm/s, the estimated amount of interpolation for every 10 nanoseconds is represented by 100 mm/s times 10 ns=1 nm.

Subsequently, the estimated amount of interpolation which has been calculated every 10 nanoseconds is sequentially added to a value obtained by measuring the position of the wafer stage which is detected at a desired time. The value obtained by the addition is regarded as representing the position of the wafer stage at every 10 nanoseconds. An amount of stage feedback is calculated on the basis of the position of the wafer stage.

Figure 5C:
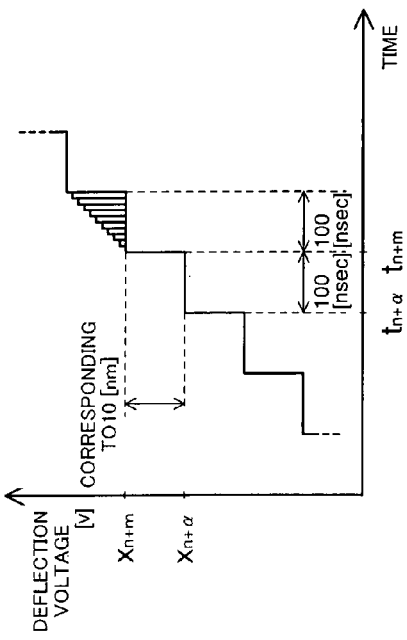

The estimated amount of interpolation is sequentially added to the position of the wafer stage which is detected at a time after the estimated amount of the interpolation is calculated. FIG. 5C shows an example in which the estimated amount of interpolation is synchronously added to the position of the wafer stage, which is detected at a time tn+m, every 10 nanoseconds, and the result of the addition is converted to a corresponding deflection voltage.

As described above, the estimated amount of interpolation is added the detected position after a time $t_n$ when extracting the distance over which the wafer stage has moved. The time when the estimated amount of interpolation can be added is determined depending on an acceleration of the wafer stage and on the allowable error in the stage feedback. In other words, when the wafer stage always moves at a constant velocity, the estimated amount of interpolation can be added at any time. In a case, however, where the movement velocity of the wafer stage is accelerated, such as a case where a pattern density or a direction in which the wafer stage moves is changed, the estimated amount of interpolation can not be always added.

In a case where, for example, an acceleration of the wafer stage is 10 m/s$^2$ and the allowable error in the stage feedback is 1 nm, a 10-microsecond time delay is allowable. In other words, when the velocity at which the wafer stage moves after 10 microseconds is accelerated with a negative acceleration of 10 m/s$^2$, an amount of change in velocity is represented by 10$^{-4}$ m/s, and an amount of the positional change of the wafer stage corresponding to the amount of change in velocity is represented by 10$^{-4}$×10$^{-5}$=1 nm. For this reason, the estimated amount of interpolation can be added until the time delay adds up to 10 microseconds if the allowable error in the stage feedback is 1 nm.

It should be noted that the estimated amount of interpolation is usually added to the position of the wafer stage which is detected immediately after the estimated amount of interpolation has been calculated. The reason for this is as follows.

It can be considered that the movement velocity of the wafer stage does not change at a time when the position of the wafer stage is measured. Alternatively, even if the velocity changes at the time, it can be considered that the change is small enough to be practically ignored.

FIG. 5D shows that the estimated amount of interpolation in every 10 nanoseconds is 1 nm as the result of the foregoing process.

Electron Beam Exposure Method

Figure 6:
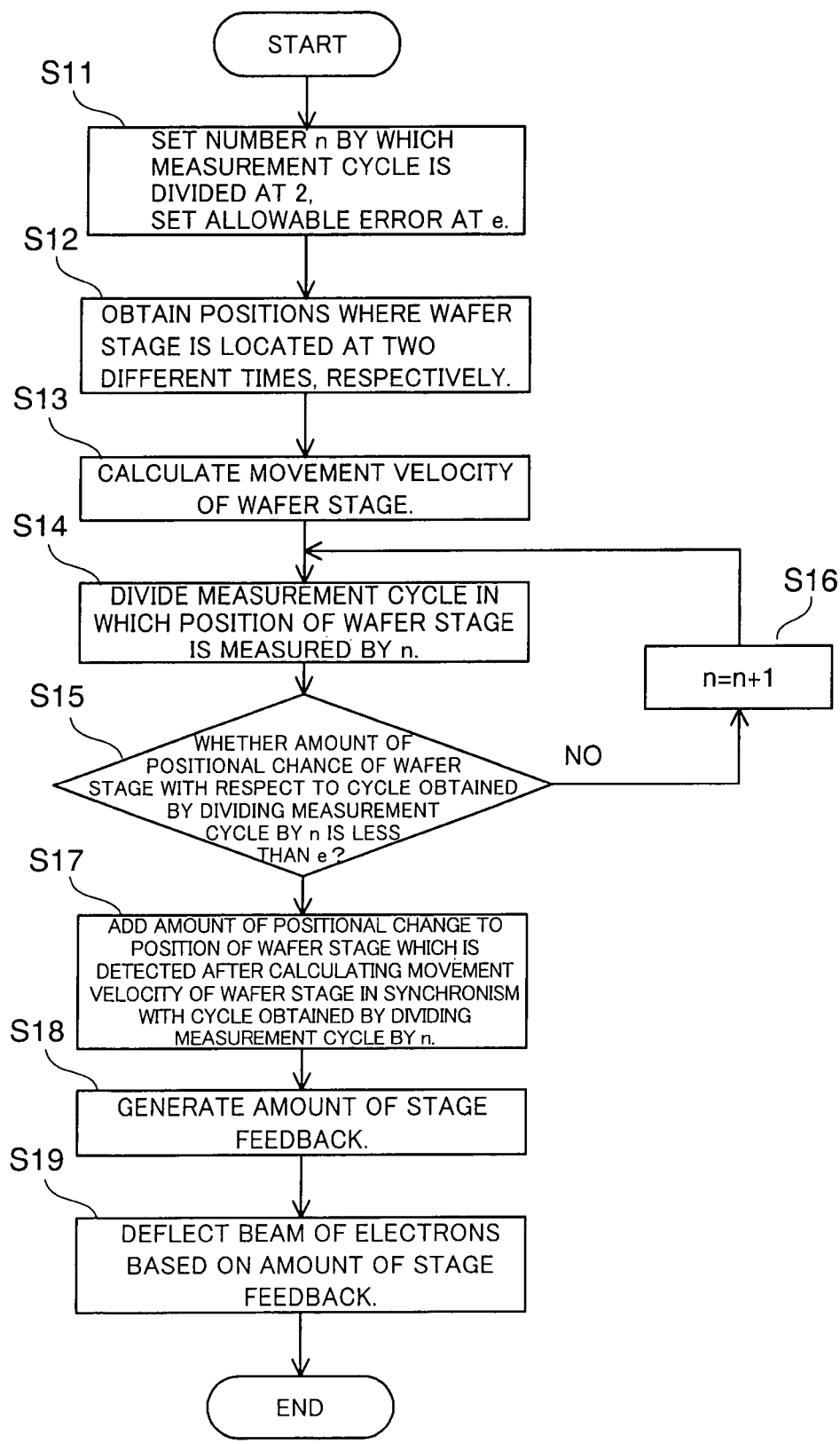
FIG. 6 is a flowchart illustrating the processes performed by the stage feedback circuit as shown in FIGS. 4A and 4B.

With reference to a flowchart in FIG. 6, descriptions will be provided below for a stage feedback process using the computation of the estimated interpolation.

First, an initialization is carried out in step S11. In the initialization step, the division number n by which to divide the measurement cycle is set to 2, and the error in the stage feedback is set to e.

In the following step S12, the computing unit 44 receives the following two pieces of information from the stage position detector. A first piece of information is on the positions of the wafer stage respectively at two different times, and a second piece of information is on the two different times when the respective positions of the wafer stage are obtained.

In the ensuing step S13, the movement velocity of the wafer stage is calculated on the basis of the amount of the positional change of the wafer stage and on the basis of the amount of change in time, which have been obtained in step S12.

In the subsequent step S14, the measurement cycle is divided by n.

In the next step S15, the estimated interpolation computing unit calculates the estimated amount of interpolation of the wafer stage 124 with respect to a time which is shorter than the measurement cycle, which is obtained by dividing the stage measurement cycle used by the laser interferometer by the division number n. Subsequently, the estimated interpolation computing unit determines whether or not the value representing this estimated amount of interpolation is within the range of the allowable error. If the value is within the range of the allowable error, the process proceeds to step S17. If the value is not within the range of the allowable error, the process proceeds to step S16, where the division number is increased. Thereafter, the process proceeds to step 14, and the process is continued.

The estimated amount of interpolation of the wafer stage 124 is calculated by multiplying the movement velocity of the wafer stage 124 by the time which is shorter than the stage measurement cycle. The velocity has been calculated in step S13.

It should be noted that the division number may be fixed in a case the measurement cycle is known in advance and it is considered that the movement velocity of the wafer stage is fixed. In other words, by what number the stage measurement cycle should be divided is determined by how large an error is allowable in the amount of movement of the wafer stage. When, for example, the allowable error in the amount of movement of the wafer stage is 1 nm, the stage measurement cycle is divided by a number which holds the difference in the amount of movement of the wafer stage within the range of 1 nm between each two measurement times corresponding to a cycle obtained by dividing the stage measurement cycle by the number. When the stage measurement cycle is 100 nanoseconds, the stage measurement cycle is divided by 10, and thus one cycle is set to 10 ns. This makes it possible to limit the difference in the movement of the wafer stage within the range of 1 nm.

In the following step S17, the estimated amount of interpolation is added to the position of the wafer stage 124 which is detected at a desired time. The estimated amount of interpolation may be added to the position of the wafer stage 124 which is measured for the first time after calculating the movement velocity of the wafer stage. Alternatively, the estimated amount of interpolation may be added to the position of the wafer stage 124 which is detected within a range determined on the basis of the acceleration of the wafer stage and the allowable error in the movement of the wafer stage.

In the ensuing step S18, an amount of stage feedback is generated on the basis of the position of the wafer stage which has been calculated in step S17.

In the subsequent step S19, the electron beam is deflected on the basis of the amount of stage feedback so that the electron beam is irradiated on the wafer in response to the movement of the wafer stage 124.

As described above, the electron beam exposure apparatus according to the present embodiment calculates the estimated amount of interpolation of the wafer stage with respect to the time (interpolation time) shorter than the measurement cycle by which the laser interferometer detects the position of the wafer stage. Thus, the electron beam exposure apparatus sequentially adds the estimated amount of interpolation thus calculated to the position of the wafer stage which is detected after calculating the estimated amount of interpolation in synchronism with the interpolation time. On the basis of the result of this addition, the electron beam exposure apparatus adjusts an amount of deflection of the electron beam, and thus irradiates the electron beam in response to the movement of the wafer stage. This makes it possible for the electron beam exposure apparatus to limit the error in the stage feedback within the range of the allowable error, conducting the writing with a higher precision, even in a case where the wafer stage moves at a higher velocity.

The present embodiment has been described with the assumption that the measurement cycle in which the position of the wafer stage is measured is 100 nanoseconds, and that the cycle shorter than the measurement cycle is 10 nanoseconds. It should be noted, however, that neither the measurement cycle nor the shorter cycle is limited to their respective examples. In a case where, for example, the movement velocity of the wafer stage is 200 mm/s, the cycle shorter than the measurement cycle may be obtained by dividing the measurement cycle by 20. Furthermore, even in a case where the movement velocity of the wafer stage is 100 mm/s, the measurement cycle may be divided by 20. In this case, the cycle shorter than the measurement cycle is 5 nanoseconds, and the estimated amount of interpolation of the wafer stage is 0.5 nm. This makes it possible to carry out writing with a higher precision. It suffices if the cycle is determined in a way that the error in the stage feedback is smaller than the allowable error (1 nm in the case of the present embodiment). By what number the stage measurement cycle is divided in order to obtain the shorter cycle is determined depending on the stage measurement cycle, the movement velocity of the wafer stage, and the allowable error in the stage feedback (1 nm).

The present embodiment has been described with the assumption that the allowable error in the stage feedback is 1 nm. However, the allowable error in the stage feedback is not limited to this example.

Modified Example

Computation of Estimated Interpolation Using Memory

Descriptions will be provided next for computation of the estimated interpolation using a memory.

This modified example is different from the foregoing embodiment in that the estimated amount of interpolation is designed to be extracted from the memory whereas the foregoing embodiment is designed to obtain the estimated amount of interpolation by calculation based on the position and the time the wafer stage is detected, and which are received from the stage position detector.

Figure 7:
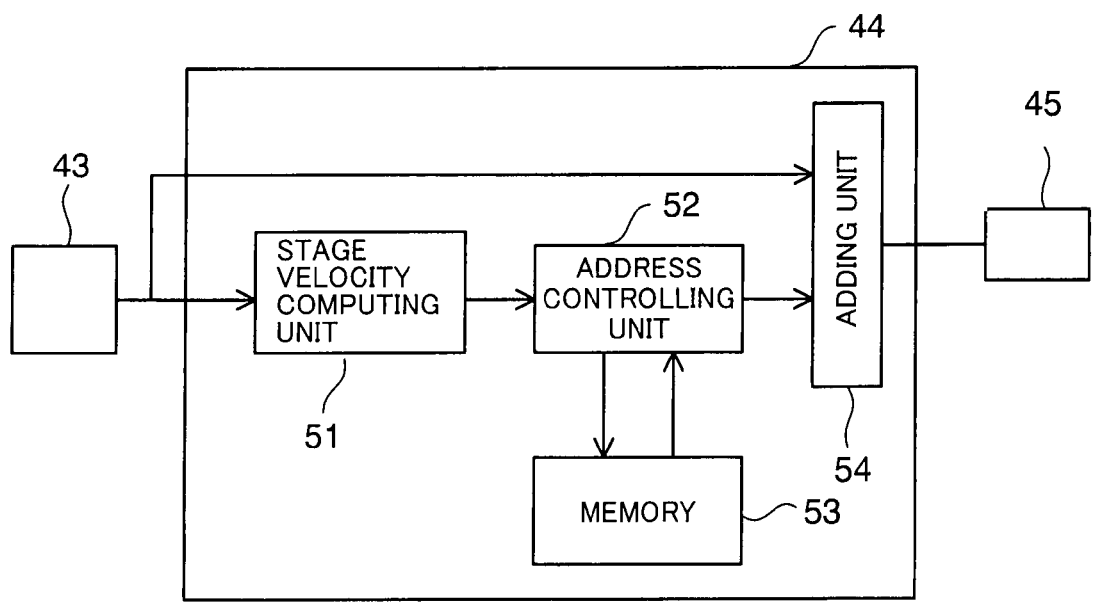
FIG. 7 is a block diagram of a configuration of an estimated interpolation computing unit using a memory.

FIG. 7 is a block diagram of a configuration of the computing unit 44 using the memory.

The computing unit 44 is configured of a stage velocity computing unit 51, an address controlling unit 52, a memory 53 and an adding unit 54.

The stage velocity computing unit 51 calculates the velocity at which the wafer stage has moved on the basis of a signal from the laser interferometer 43.

The address controlling unit 52 controls an address at which the memory 53 is accessed on the basis of the velocity of the wafer stage.

The memory 53 stores data which is going to be added to the position of the wafer stage depending on the velocity of the wafer stage as the estimated amount of interpolation.

The adding unit 54 adds the position of the wafer stage which is detected by the laser interferometer 43 to the estimated amount of interpolation which has been extracted from the memory 53.

Descriptions will be provided below for the computation of the estimated amount of interpolation with use of the computing unit 44 configured in this manner. The movement velocity of the wafer stage is calculated on the basis of two different positions and the respective times the wafer stage is detected, which have been received from the laser interferometer 43.

The address controlling unit 52 receives the velocity at which the wafer stage has moved, and changes address values at which the memory 53 is accessed depending on the movement velocity of the wafer stage. In other words, an address is determined by adding a value representing the movement velocity of the wafer stage to an address A defined as a reference.

The address controlling unit 52 accesses the memory 53 by the address thus calculated, and extracts the estimated amount of interpolation depending on the movement velocity of the wafer stage from the memory 53.

For example, when the velocity at which the wafer stage has moved is 100 m/s, the access controlling unit 52 accesses an address A+100 of the memory 53. Thereby, the address controlling unit 52 extracts the estimated amount of interpolation every 10 nanoseconds.

Figure 8:
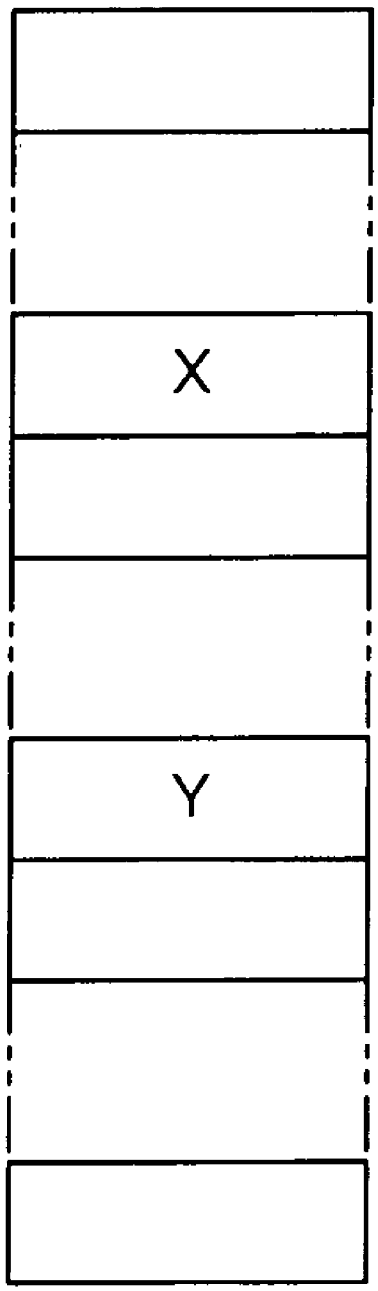
FIG. 8 is a diagram showing an example of a configuration of the memory.

FIG. 8 is a diagram showing an example of a configuration of the memory. For example, an estimated amount of interpolation X (for example, 0.2 nm) in every 10 nanoseconds which is defined for a case where the movement velocity of the wafer stage is 20 mm/s is stored in an address A+20. In addition, an estimated amount of interpolation Y (for example, 1 nm) in every 10 nanoseconds which is defined for a case where the movement velocity of the wafer stage is 100 mm/s is stored in an address A+100.

The address controlling unit 52 transmits the extracted estimated amount of interpolation to the adding unit 54. The adding unit 54 adds the estimated amount of interpolation to the position of the wafer stage which has been detected by the laser interferometer 43, and transmits the result of the addition to the DAC-AMP unit 45.

This makes it possible to decrease the error in the stage feedback, and to accordingly deflect the electron beam in response to the movement of the wafer stage.

It should be noted that estimated amounts of interpolation which fall within the range of the allowable error in the stage feedback are stored in the memory 53. This makes it possible to carry out writing with a higher precision even in a case where the movement velocity of the wafer stage is increased for the purpose of increasing the throughputs.

Furthermore, in the case where the memory 53 is used, no estimated amount of interpolation has to be calculated on the basis of the movement velocity of the wafer stage, because estimated amounts of interpolation are beforehand defined. This reduces process load imposed on the microcomputer's calculation of the estimated amounts of interpolation. The computation of the estimated amounts of interpolation using the memory 53 thus configured is effective when the wafer stage measurement cycle and the stage feedback are fixed at their respective predetermined values.

What is claimed is:

1. An electron beam exposure apparatus comprising:
an electron gun for generating an electron beam;
a deflector for deflecting the electron beam;
a wafer stage on which a wafer is placed;
a stage position detector for detecting a position of the wafer stage;
a memory in which an amount of the positional change is stored where the amount of the positional change corresponds to the movement velocity of the wafer stage;
a stage position calculator for calculating a movement velocity of the wafer stage on a basis of a distance over which the wafer stage has moved, and on a basis of a time which it has taken for the wafer stage to move over the distance, the wafer stage having been detected by the stage position detector, subsequently for calculating an amount of positional change of the wafer stage with respect to an interpolation time which is shorter than a measurement cycle used by the stage position detector on a basis of the movement velocity thus calculated, thereafter for calculating an amount of positional movement of the wafer stage by sequentially adding the amount of the positional change to a position of the stage which is measured by the stage position detector in synchronism with the interpolation time, and thereby calculating an amount of deflection of the electron beam which corresponds to the amount of the positional movement of the wafer stage; and
a deflection controller for causing the deflector to deflect the electron beam on a basis of the amount of deflection of the electron beam;
wherein the stage position computing unit accesses the memory by a value corresponding to the movement velocity of the wafer stage as an address, and extracts the amount of the positional change corresponding to the movement velocity of the wafer stage from the memory.

2. The electron beam exposure apparatus according to claim 1, wherein the stage position computing unit calculates the amount of the positional change by multiplying the movement velocity of the wafer stage by the interpolation time.

3. The electron beam exposure apparatus according to claim 1, wherein the stage position computing unit determines the interpolation time in a way that the amount of the positional change is less than a predetermined value.

4. The electron beam exposure apparatus according to claim 3, wherein the predetermined value is 1 nm.

5. The electron beam exposure apparatus according to claim 1, wherein, when the stage position computing unit determines that the movement velocity is not less than 20 mm/s, the stage position computing unit calculates the amount of the positional change, the amount of the positional movement of the wafer stage, and the amount of deflection of the electron beam.

* * * * *